United States Patent [19]

Okada et al.

[11] Patent Number: 5,777,792
[45] Date of Patent: Jul. 7, 1998

[54] OPTICAL FILM, AN ANTIREFLECTION FILM, A REFLECTION FILM, A METHOD FOR FORMING THE OPTICAL FILM, THE ANTIREFLECTION FILM OR THE REFLECTION FILM AND AN OPTICAL DEVICE

[75] Inventors: Nobumasa Okada; Sigeo Ohsaka; Shuichi Miura, all of Kawasaki, Japan

[73] Assignee: Fujitsu Limited, Kawasaki, Japan

[21] Appl. No.: 278,074

[22] Filed: Jul. 20, 1994

[30] Foreign Application Priority Data

Aug. 25, 1993 [JP] Japan ................ 5-210047
Dec. 20, 1993 [JP] Japan ................ 5-320458

[51] Int. Cl.$^6$ ................ G02B 1/10; H01S 3/19
[52] U.S. Cl. ................ 359/584; 359/581; 359/586; 359/900; 372/49
[58] Field of Search ................ 359/359, 360, 359/580, 586, 588, 582, 584, 581, 900; 372/49; 204/219.27

[56] References Cited

U.S. PATENT DOCUMENTS

| 4,649,088 | 3/1987 | Mitsui et al. | 359/580 |
| 4,673,476 | 6/1987 | Mitsui et al. | 204/192.28 |
| 4,770,479 | 9/1988 | Tustison | 359/360 |
| 4,797,895 | 1/1989 | Kokubo et al. | 372/49 |
| 4,968,886 | 11/1990 | Wan et al. | 250/332 |
| 5,085,926 | 2/1992 | Iida et al. | 359/359 |
| 5,336,565 | 8/1994 | Muromachi et al. | 359/359 |
| 5,464,683 | 11/1995 | Rudigier et al. | 428/216 |

FOREIGN PATENT DOCUMENTS

| A-0526966 | 2/1993 | European Pat. Off. |
| A-0536607 | 4/1993 | European Pat. Off. |

OTHER PUBLICATIONS

Chitose et al., *Patent Abstracts of Japan* 14(145): 1990.

*Primary Examiner*—Paul M. Dzierzynski
*Assistant Examiner*—John Juba, Jr.
*Attorney, Agent, or Firm*—Armstrong, Westerman, Hattori, McLeland & Naughton

[57] ABSTRACT

An optical film of the present invention is of multi-layered structure which has a high-refractive-index layer composed of titanium oxidic nitride, aluminum oxidic nitride, or silicon oxidic nitride.

24 Claims, 6 Drawing Sheets

OPTICAL FILM, AN ANTIREFLECTION FILM, A REFLECTION FILM, A METHOD FOR FORMING THE OPTICAL FILM, THE ANTIREFLECTION FILM OR THE REFLECTION FILM AND AN OPTICAL DEVICE

BACKGROUND OF THE INVENTION

1. Field of the Invention

The invention relates to an optical film and a method for forming it, and an antireflection film and a method for forming it, and a reflection film and a method for forming it, and an optical device having an optical film.

2. Description of the Related Art

In recent years, optical telecommunication systems using optical fibers have been made longer in distance, greater in capacity, and faster in speed, and light has been used for signal transmission between integrated circuits. In such a manner as this, information transmission technologies utilizing lightwave been remarkably developed.

In order to make a greater progress in the technologies utilizing light, it is necessary to develop a high-output and stable light source precisely made, a means for precisely controlling light, a transmission path lower in loss, an optical transducer lower in loss, and the like. A means for precisely controlling light includes to use various optical films in an optical transmission path, an optical transducer, and the like, and to use an antireflection film, a reflection film, and the like for composing a resonator of a semiconductor laser (a laser diode).

An antireflection film used for a semiconductor optical device is described in the following.

For example, an antireflection film formed on the optical output end face of a semiconductor laser is required to be 0.01% or less in reflectivity. In an ordinary technical field of lens coating, a dielectric film of multi-layered structure comprising 15 layers is adopted as an antireflection film in order to attain such reflectivity as this.

In a semiconductor laser also, it is thought to use such a multi-layered dielectric film as this, but the same optical film as used in a technical field of lens coating cannot be applied to the semiconductor laser as it is, since a material composing the film or a method for forming the film is one of the determinate factors controlling life time of the optical semiconductor device. Since in a semiconductor laser there are restrictions on material of an antireflection film or a method for forming the film from a viewpoint of its composing material or its construction, there is no way except selecting a material or method on the basis of experimental facts. And considering difference in coefficient of thermal expansion between the film and the semiconductor laser, it is desirable to make the number of layers composing the antireflection film as small as possible.

The smallest number of layers for obtaining reflectivity useful for the purpose of an antireflection film is "2". For example, a film of two-layered structure comprising optical films of high and low refractive indexes is used as an antireflection film derived from computing an optical propagation constant of a semiconductor laser of 1.55 μm in wavelength, in which the optical film of high refractive index is 2.44 in refractive index and 1450 Å in thickness and the optical film of low refractive index is 1.37 in refractive index and 2750 Å in thickness. The reflectivity obtained by this antireflection film is kept to be 0.01% or less.

An optical film of 1.37 in refractive index can be formed by an ordinary vacuum deposition method using such an optical material as lithium fluoride (LiF) or magnesium fluoride ($MgF_2$), but an optical material composing an optical film of 2.44 in refractive index is unknown yet. Although zinc selenium (ZnSe) of 2.46 in refractive index is used as a material having a refractive index near to 2.44, this material cannot be greatly changed in refractive index.

A reflection film used in an optical device is described in the following.

For example, a reflection film for composing a resonator of a semiconductor laser is required to be low in loss and comparatively high in reflectivity so as to match with characteristics of the device.

In a technical field of lens coating or the like where a wavelength range of visible light is mainly used, it is known that a high reflectivity of low loss can be obtained by combining such a high-refractive-index optical film of 2.0 to 2.4 in refractive-index as zinc sulfur (ZnS), cerium oxide ($CeO_2$), or zinc selenium (ZnSe) together with such a low-refractive-index optical film of 1.35 to 1.47 in refractive-index as silicon dioxide ($SiO_2$), $MgF_2$, or LiF.

However, since wavelength of a laser light is in a near infrared range in a technical field of a semiconductor laser made of compound semiconductor of the III to V groups, two conditions need to be satisfied that the high-refractive-index optical film has a higher refractive index than the above-mentioned refractive index of 2.0 to 2.4 and that the optical films have little light absorption so as to obtain a high output. Therefore, the above-mentioned materials of high refractive index are not optimal. Silicon (Si), germanium (Ge), and the like are known as a material satisfying the condition of having a high refractive index, and for example, there is a high-reflectivity film of multi-layered structure in which a pair of Si and $SiO_2$ layers are respectively formed in thickness of ¼ wavelength. Although a reflection film of this combination is used in a semiconductor laser, it does not fully satisfy the above-mentioned two conditions, since Si and Ge have a light absorption band in the near infrared range.

Although various improvements of crystal growing methods have been suggested as a method for reducing light absorption of the Si layer, they have hardly brought any good result.

For example, a method of growing a silicon film by means of deposition has a merit that thermal damage is little given to the semiconductor because of formation of the film at a low temperature and the film thickness can be precisely controlled by setting a film thickness gauge inside the chamber, but on the contrary the method has a demerit that the silicon film has a great light absorption since it is polycrystalline.

And although a method of growing a silicon film by means of CVD can stably make a specified film quality, it gives some damage to the semiconductor since it is a high-temperature process.

Even if in case of using a silicon layer as a high-refraction-index layer composing a multi-layered reflection film there is a method of improving its crystallinity in a low-temperature process, the silicon interferes with the laser oscillation when it comes in contact with the p-n junction interface of the semiconductor laser since the silicon is higher in electric conductivity than such dielectric as glass.

As mentioned above, since a semiconductor laser does not give a designed performance in case that a specified refractive index cannot be obtained for a high-refractive-index layer to compose a multi-layered antireflection film or reflection film, a material of an optical film having a refractive index optimal for improving its performance or a method for forming such an optical film is desired.

And an optimal refractive index of an optical film composing an antireflection film or reflection film to be used for a semiconductor optical device does not have only one value, but needs to be changed according to structure of an optical waveguide of the semiconductor laser. Therefore, a technique capable of freely adjusting a refractive index of the antireflection film or reflection film is desired.

SUMMARY OF THE INVENTION

It is an object of the present invention to provide an optical film having a high-refractive-index layer whose refractive index can be changed in a wide range according to its growth conditions and to provide a method for forming the optical film and an optical device having the optical film. And other objects of the invention are to provide an antireflection film having an optimal high-refractive-index layer and a method for forming the antireflection film and still further to provide a reflection film having an optimal high-refractive-index layer and a method for forming the reflection film.

The present invention makes a high-refractive-index layer in a multi-layered optical film of titanium oxynitride (TiON) and makes a high-refractive-index layer composing a multi-layered antireflection film or reflection film of titanium oxynitride.

A titanium oxynitride film is easily adjusted in refractive index in a range of 2.2 to 4.0 by properly choosing conditions of an ion assist deposition method.

Since its growth temperature is as low as a silicon growth, the growing process does not affect a device characteristics in case of applying it to a semiconductor optical device. And the titanium oxynitride film is a dielectric film and so it does not cause electric current to leak in case that the titanium oxynitride film is formed on a p-n junction interface of the semiconductor optical device. Furthermore, since the light absorption by its crystal is less as compared with silicon and is as slight as ZnSe, attenuation in intensity of the optical input and output of the optical device is suppressed.

Therefore, the light emission or light detection by an optical device results in being precisely controlled by forming a multi-layered optical film having an optimal refractive index for each of various optical devices.

DESCRIPTION OF THE PREFERRED EMBODIMENTS

The present inventors determined the use of titanium oxynitride (TiON) and other oxygen and nitrogen compounds of dielectric instead of using ZnS, $CeO_2$, ZnSe, Si, Ge, or the like as a material of high-refractive-index optical films composing a multi-layered reflection film or a multi-layered antireflection film.

And as a method for forming oxidic nitride we used an ion assist deposition method which keeps low a heating temperature of the ground layer the TiON is to be deposited on, gives a very good adhesion of the TiON film and the ground layer, and makes it easy to adjust a refractive index of the TiON film. The ion assist deposition method is a method for forming a film by irradiating ions of plural elements onto a substrate.

In case of using the ion assist deposition method for forming an optical film, two methods for controlling a refractive-index include (1) adjusting a refractive index of an optical film by increasing a filling degree of the optical film through irradiating ions of a component element of the optical film onto the grown optical film and (2) adjusting a refractive index of an optical film by changing a composition ratio of elements composing the optical film, where the "filling degree" shows a degree of the number of holes existing in atomic unit inside an optical film formed by deposition, and the larger the filling degree is, the smaller the number of holes is.

The former method (1) has a more narrow range of adjusting the refractive index, while the latter method (2) has a wider range of adjusting the refractive index.

The present inventors found a method of forming an optical film having a TiON film or other oxygen and nitrogen compound films by means of an ion assist deposition method and a method of applying the optical film to such an optical device as a light detecting device, a light emitting device, and an optical modulator, or to such optical parts as optical fiber and lenses. The methods are described in detail in the following.

Before description of an optical film according to the invention, construction of an ion assist deposition apparatus used for forming the optical film is described in brief.

Figure 1:
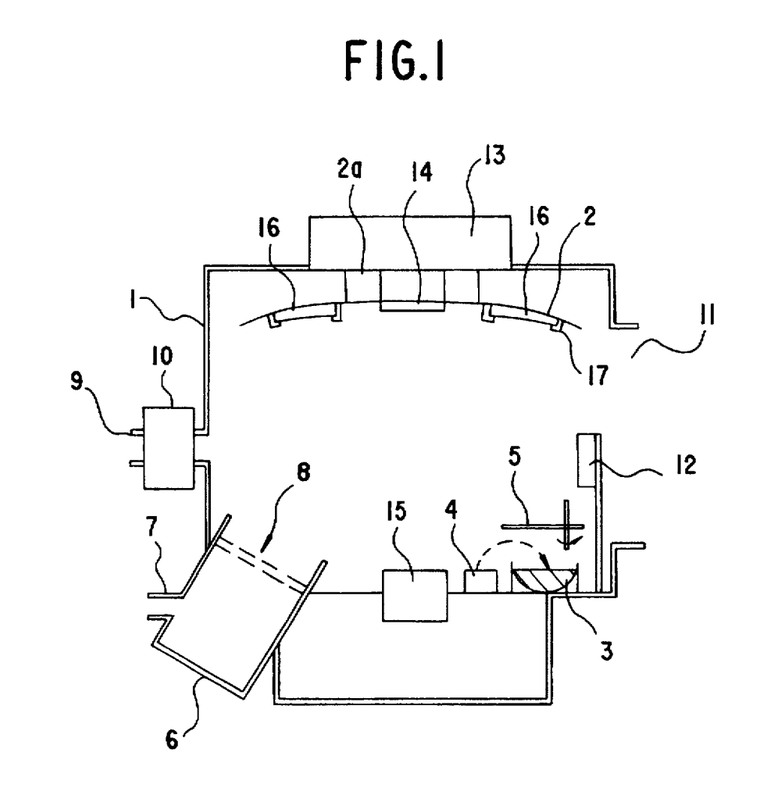
FIG. 1 is a structural drawing for showing an example of an ion assist deposition apparatus used for forming an optical film of the present invention.

FIG. 1 is a structural drawing for showing an overview of an ion assist deposition apparatus used for forming an optical film of the present invention.

On the ceiling of a deposition chamber 1, a rotary dome 2 (substrate supporting plate) to hold substrates 16 on its downside face so as to be turned by a revolving part 2a. On one corner of the bottom of the deposition chamber 1, a crucible 3 of cartridge type for containing a raw material is set opposite to the substrate supporting face of the rotary dome 2. A shutter 5 which can freely open and close is set on the crucible 3, and an electron gun 4 for irradiating electrons onto the raw material in the crucible 3 of cartridge type is set next the crucible 3. On another corner of the bottom of the deposition chamber 1, an ion gun 6 of Kaufmann type (whose gas discharging outlet is 80 mm in diameter and 1100 mm distant from the center of the rotary dome 2) is set opposite to the substrate supporting face of the rotary dome 2. This ion gun 6 introduces gas through an ionizing gas introducing intake 7, ionizes the gas with thermal electrons from a filament (unshown), and discharges the ionized gas toward the rotary dome 2 by some voltage applied to an ion accelerating electrode 8.

A gas introducing intake 9 is formed in the side wall of the deposition chamber 1 between the ion gun 6 and the rotary dome 2, and a gas introduced through the gas introducing intake 9 is adjusted in flow by means of an automatic pressure regulator 10. An exhaust outlet 11 is made in the side wall of the deposition chamber 1 opposite to the gas introducing intake 9 and a deposition rate monitor 12 of crystal oscillator type is set near to the exhaust outlet 11 and the shutter 5.

On the upside of the middle part of the rotary dome 2 a first film thickness monitor 13 of photoelectric type for monitoring film thickness with a reflected light is provided, which monitors thickness of the film formed on a glass substrate 14 for monitoring which is set on the downside face of the middle part of the rotary dome 2. And opposite to the first film thickness monitor 13 of photoelectric type and between the ion gun 6 and the electron gun 4, a second film thickness monitor 15 of photoelectric type is provided, which measures thickness of the film on the surface of the glass substrate 14 for monitoring on the basis of a light which has transmitted through the glass substrate 14. A light source of the transmitted light is inside the first film thickness monitor 13 of photoelectric type. The reflected light is 0.65 μm in wavelength and the transmitted light is 1.55 μm in wavelength.

Reference number 17 shows a holder for holding the substrate 16 on the downside face of the rotary dome 2.

Film forming methods are described in the following. First to third embodiments relate to methods for forming a high-refractive-index layer to compose an antireflection film, and embodiments following them relate to methods for forming a high-refractive-index layer to compose a reflection film.

(First example)

A method for forming an optical film of the first embodiment by means of the above-mentioned ion assist deposition apparatus is described in the following.

This embodiment makes a high-refractive-index optical film of TiON which composes a two-layered antireflection film to be used in a semiconductor laser of 1.55 μm in wavelength as an example. It is desired to control an refractive index of the high-refractive-index optical film to be in a range of 2.50 to 2.60 to make it function as an antireflection film for that wavelength.

First, substrates 16 to have an optical film formed on them are mounted on the downside face of the rotary dome 2 around the glass substrate 14 for monitoring, and a crucible 3 of cartridge type filled with $Ti_3O_5$ which is a raw material is set in the deposition chamber 1, and then gas inside the deposition chamber 1 is exhausted through the exhaust outlet 11. And oxygen ($O_2$) gas is introduced into the ion gun 6 through the ionizing gas introducing intake 7, and an ionizing current of 20 mA is run in the ion gun 6 by applying a voltage of 1 kV to the ion accelerating electrode 8, and the oxygen ionized by this is discharged inside the deposition chamber 1.

And then nitrogen ($N_2$) gas is introduced into the deposition chamber 1 through the gas introducing intake 9. At this time a flow rate of the gas being introduced through the gas introducing intake 9 is controlled by the automatic pressure regulator 10, so that the pressure inside the deposition chamber 1 is kept at $4.5 \times 10^{-3}$ Pa.

Furthermore, an electron beam emitted from the electron gun 4 is irradiated onto the $Ti_3O_5$ in the crucible 3 of cartridge type as changing its track by 180 degrees through a magnetic field. After vaporizing the $Ti_3O_5$ by this, the shutter 5 is opened to discharge the vapor of the $Ti_3O_5$ toward the downside face of the rotary dome 2.

In this case, for example, a voltage of 6.0 kV is applied to an electrode inside the electron gun 4.

Thus, the vaporized titanium oxide and the ionized oxygen and nitrogen are supplied to the substrates 16 under the rotary dome 2 and the monitoring glass substrate 14 beside them so that a TiON film may be deposited on the downside faces of them at a deposition rate of 0.3 to 1.0 Å/sec. The deposition rate can be controlled by an amount of electric current being run in the electron gun 4.

Growth of this TiON film is detected by the film thickness monitor 13 of photoelectric type on the rotary dome 2. The film thickness monitor 13 of photoelectric type has a light source and a light detector, and a light emitted from the light source is reflected by the TiON film deposited on the surface of the monitoring glass substrate 14. And an amount of the reflected light is detected by the light detector and the film thickness is obtained on the basis of the amount of the reflected light.

And the film thickness is detected also by the film thickness monitor 15 of photoelectric type.

A part of the material vaporized from the crucible 3 of cartridge type is deposited on a crystal plate inside the deposition rate monitor 12 of crystal oscillator type, and the deposition rate is measured on the basis of variation in frequency of the crystal plate caused by increase of an amount of the deposited material.

Figure 2:
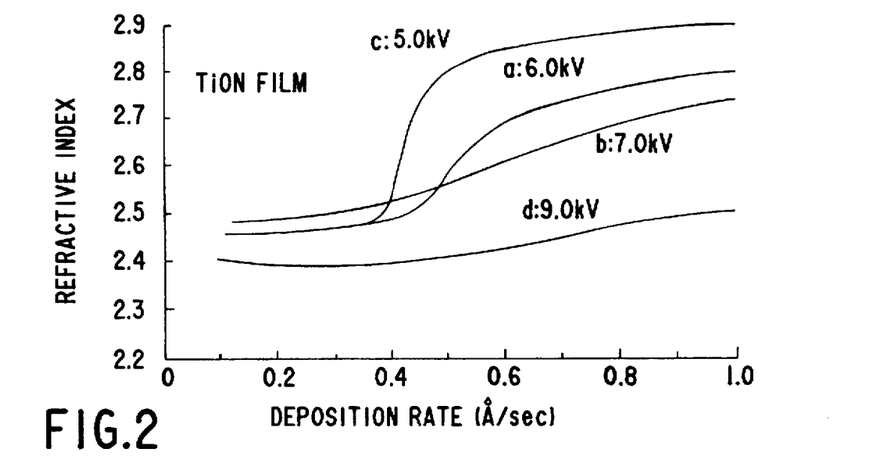
FIG. 2 is a characteristic graph showing the relation between a deposition rate and refractive index of a TiON film of the present invention formed by means of an ion assist deposition method.

According to an experiment, a curve showing relation between a deposition rate and a refractive index is shown in curve a in FIG. 2. Supposing that a refractive index necessary for the optical film is 2.55 and an effective range of its variation (error) is ±0.05, the deposition rate is controlled within a comparatively narrow range of 0.44 to 0.51 Å/sec. Refractive indexes shown in the following are values measured on the basis of wavelength of visible light, unless specified in particular. Next, the relation between a deposition rate and a refractive index in case of using a voltage applied to the electron gun 4 as a parameter is shown in of FIG. 2.

FIG. 2 shows relation between a deposition rate and a refractive index of a TiON film by means of an ion assist deposition method, where the axis of abscissa shows a deposition rate of an optical film made of TiON and the axis of ordinate shows a refractive index of it. Curve a in FIG. 2, as described above, shows a result of measurement of a refractive index in case of fixing at 6.0 kV a voltage applied to the electron gun 4 irradiating electrons onto the raw material and changing a deposition rate of the TiON film through changing electric current flowing in the electron gun 4. According to the result, there is a range of deposition rate in which a refractive index of the TiON film can be greatly varied.

Curve b in FIG. 2 shows variation of a refractive index in case of fixing a voltage applied to the electron gun 4 at 6.0 kV and changing a deposition rate of the TiON film through changing electric current flowing in the electron gun 4. It is found that variation of a refractive index of the TiON film in curve b is less influenced by a deposition rate and is kept at a lower level than a case in curve a. As the result, in case of making a film having a refractive index of 2.55 and an effective variation range of ±0.05, a necessary control range of a deposition rate is so wide as 0.30 to 0.60 Å/sec that a refractive index of the film may be more easily controlled because of less influence of the deposition rate upon variation of the refractive index.

Curves c and d in FIG. 2 show limits of adjustment of a voltage of the electron gun 4.

The curve c in FIG. 2 shows variation of a refractive index in case of fixing a voltage applied to the electron gun 4 at 5.0 kV and changing a deposition rate through changing electric current flowing in the electron gun 4. In this case, it is found to be difficult to control a refractive index of 2.55 within an effective range of ±0.05, since the refractive index is sharply changed according to variation of a deposition rate. In case of growing a TiON film in a range of deposition rate where its refractive index is sharply changed as applying such a voltage as this to the electron gun 4, the optical film is poor in repeatability of its refractive index and results in having partly various refractive indexes in itself. Such undesirable fact is liable to appear also in case that the applied voltage is lower than 6.0 kV.

The curve d shows variation of a refractive index in case of fixing a voltage applied to the electron gun 4 at 9.0 kV and changing a deposition rate through changing electric current flowing in the electron gun 4. According to this, the refractive index is more gently changed as compared with curve b, but this does not give a refractive index of 2.50 even at a deposition rate of 1.0 Å/sec.

Thus it is found that the higher the voltage applied to the electron gun 4, the less the refractive index is influenced by the deposition rate. On the other hand, in case that the voltage applied to the electron gun 4 is too high, a range of adjusting a refractive index of the optical film is narrow and it is difficult to effectively adjust the refractive index. It is found that there is an optimal range for a voltage applied to the electron gun 4 in case of controlling a deposition rate by means of electric current flowing in the electron gun 4.

According to this embodiment, in case that a voltage applied to the electron gun 4 is set in a range of 6.0 kV to 8.0 kV on the basis of relation among a voltage applied to the electron gun 4 and an electric current supplied to the electron gun and a deposition rate and a refractive index, a refractive index of an optical film is controlled and is improved in controllability of it and an optical film having a desirable refractive index can be easily formed.

The above-mentioned conditions can be applied also in case of adjusting a refractive index layer of an optical film of aluminum-oxygen-nitrogen compound, silicon-oxygen-nitrogen compound, and other oxygen-nitrogen compound.

This embodiment provides an optical film forming method of adjusting a refractive index of a TiON film by changing a deposition rate through changing electric current of the electron gun 4 as setting a voltage applied to the electron gun in a range where the refractive index does not vary so much depending upon a deposition rate in case of forming an optical film of TiON by means of an ion assist deposition method. In this case, it is possible also to adjust a refractive index of an optical material itself by varying an ion ratio of oxygen to nitrogen in addition to a raw material of an optical film to form the optical film on a substrate.

(Second embodiment)

In the first embodiment, in case of forming a high-refractive-index layer of an antireflection film of a semiconductor laser of 1.55 μm in wavelength, only oxygen gas is introduced through the ion gun 6. This is for improving controllability of the refractive index. The reason is in detail described in the following.

Up to now, an object of forming a film by means of an ion assist deposition method is to improve adhesion of the film without heating the substrate, and this property is particularly attractive in case of forming a film composing a semiconductor device.

Figure 3:
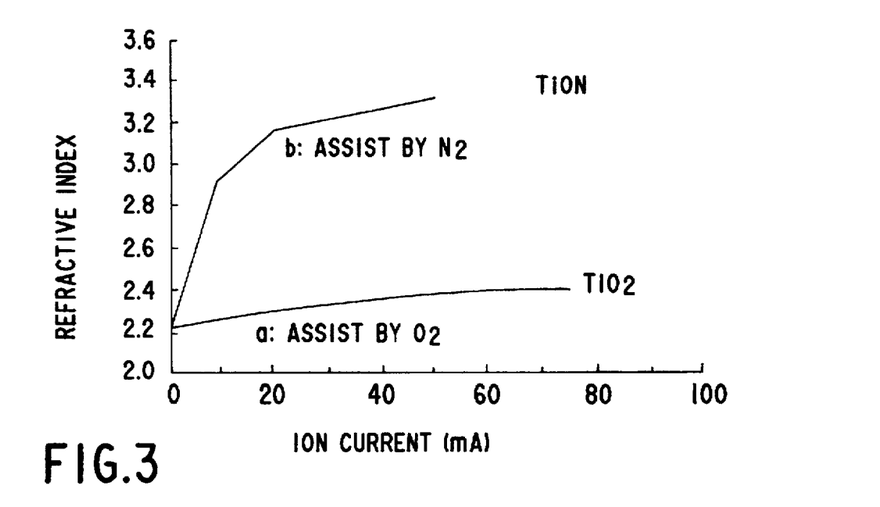
FIG. 3 is a characteristic graph showing the relation between ion current and refractive index of an optical film in an ion assist deposition method to assist an element composing an optical film of the present invention.

This method has an effect of making greater a refractive index of the film grown by this method by irradiating ions of an element composing the optical film onto the substrate, and the refractive index of the optical film is adjusted as described above. FIG. 3 shows relation between ion current of the ion gun 6 and a refractive index of an optical film in case of forming the optical film of TiON by means of an ion assist deposition method, where the axis of abscissa shows an ion current and the axis of ordinate shows a refractive index of the grown optical film.

According to curve a in FIG. 3, since a raw material $Ti_3O_5$ is turned into $TiO_2$ through taking in oxygen when irradiating oxygen ions in addition to $Ti_3O_5$ inside the crucible 3 of cartridge type, it is found that a refractive index of an optical film is little changed even in case of increasing the ion current. In this case, nitrogen gas is introduced through the gas introducing intake 9.

In case of applying this optical film forming method to forming an optical film of a semiconductor laser, if intensity of the ion irradiation is increased too much for the purpose of increasing the ion current, sufficient energy cannot be given because of damaging the semiconductor laser and therefore an optical film having a necessary refractive index may be not obtained.

As a method for compensating this problem, a method comprises forming a compound different from a raw material by irradiating intentionally ions not contained in the raw material inside the crucible 3. According to this, it is possible to greatly change a refractive index by changing an amount of ions. For example, in case of forming a TiON film as irradiating nitrogen ions onto the raw material $Ti_3O_5$, the TiON film greatly varies in refractive index, as shown by curve b in FIG. 3.

Namely, a refractive index can be greatly varied by implanting ions of an element, namely, nitrogen different from a raw material in addition to the raw material $Ti_3O_5$.

However, as known from curve b, since a refractive index is sharply increased with increase of ion current in a range where the ion current is near 20 mA, it is not easy to control a refractive index in a range of 2.45 to 2.90, for example.

Then, when the present inventors made an ion assist operation as introducing nitrogen and oxygen at the same time into the ion gun 6 in addition to vaporizing the $Ti_3O_5$ from the crucible 3, it was found that oxygen was difficult to be implanted into the $Ti_3O_5$ and an optical film could not be greatly changed in refractive index. The reason is thought that nitrogen is ionized more greatly than oxygen.

Figure 4:
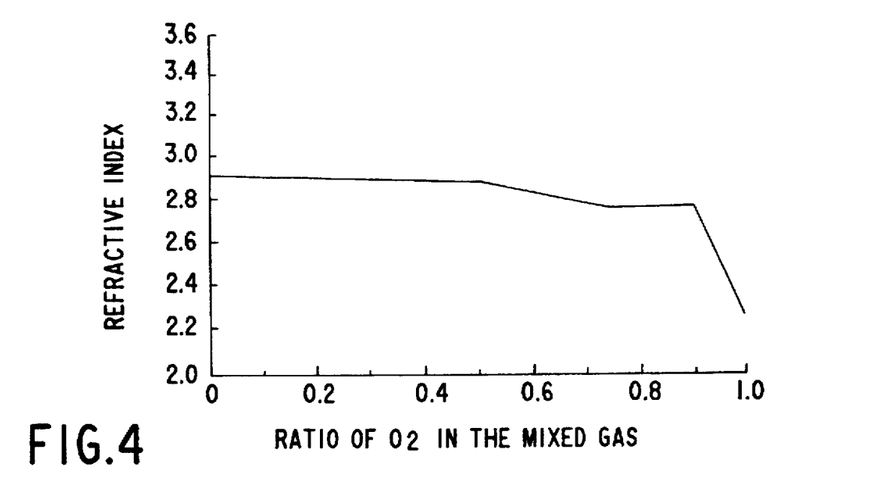
FIG. 4 is a characteristic graph showing the relation between a ratio of oxygen in a oxygen-nitrogen mixed gas and a refractive index in case of forming an optical film of the present invention by means of an ion assist deposition method.

Furthermore, when an experiment of forming a TiON film as changing a ratio of oxygen contained in a mixed gas of oxygen and nitrogen was conducted, a refractive index of the film was greatly changed at a ratio of oxygen of 90% or more in the mixed gas, as shown in FIG. 4, where the axis of abscissa shows a ratio of oxygen contained in the mixed gas of nitrogen and oxygen and the axis of ordinate shows a refractive index of the optical film.

Figure 5:
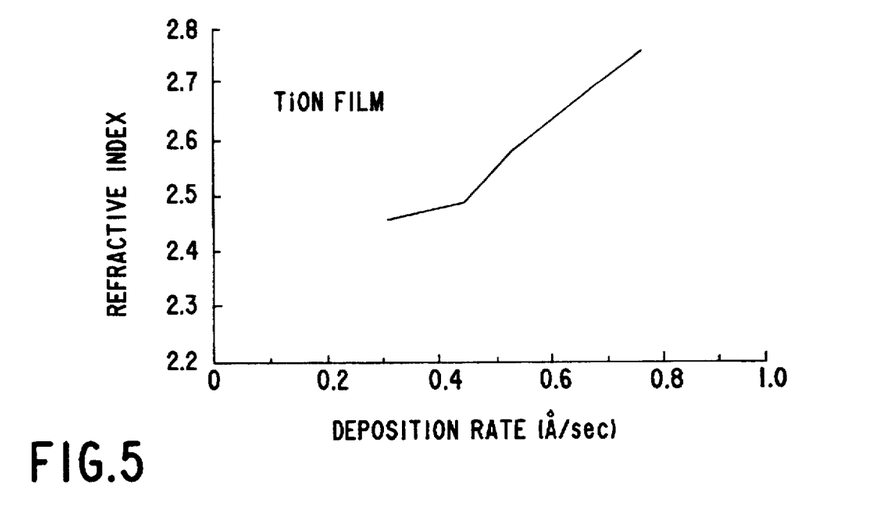
FIG. 5 is a characteristic graph showing the relation between a deposition rate and refractive index of an optical film of the present invention formed by means of an ion assist deposition method introducing nitrogen and oxygen respectively from intakes different from each other.

When a bonding state of ions of nitrogen and oxygen in an optical film was controlled by introducing such a gas to be comparatively intensely ionized as nitrogen through only the gas introducing intake 9 distant from the ion gun 6 and introducing such a gas to be comparatively gently ionized as oxygen into the ion gun 6, an experimental result was obtained as shown in FIG. 5, where the axis of ordinate shows a refractive index and the axis of abscissa shows a deposition rate. The deposition rate is controlled by changing electric current of the electron gun 4.

It is confirmed from the curve in this figure that the formed optical film varies gently and linearly in its refractive index over a wide range of deposition rate.

As known from this result, oxygen is ionized by thermal electrons emitted from a filament inside the ion gun 6 and the oxygen ions are taken out and accelerated by a voltage applied to an ion accelerating electrode 8 and the taken-out oxygen ions ionize the nitrogen introduced through the gas introducing intake 9 of the deposition chamber to grow a TiON film on the substrates 16. In this case, a refractive index of the film is determined according to a bonding state of ions of the nitrogen and oxygen implanted into the TiON film and the bonding state is adjusted by changing the deposition rate.

According to such a method as this, since a refractive index of a grown optical film is not influenced by variation of the ion current, an optical film is formed by a gentle ion irradiation and damage to be given to a semiconductor laser can be reduced.

Utilizing the above-mentioned technology, a process of forming a high-refractive-index layer composing a two-layered antireflection film applied to a semiconductor laser of 1.55 μm in wavelength is described in the following. The two-layered antireflection film is composed of a low-refractive-index optical film of 1.37 in refractive index and a high-refractive-index optical film of 2.44 in refractive index. First, the crucible 3 of cartridge type is filled with a raw material $Ti_3O_5$ and is mounted inside the deposition chamber 1.

Next, a monitoring glass substrate 14 is set for measuring thickness of a deposited film on the downside face in the middle of the rotary dome 2 for mounting substrates, and plural substrates 16 are set around the glass substrate 14 with their deposition faces down. The rotary dome 2 for mounting substrates is revolved at a speed where irregularity in distribution of deposition flow on the surface of each substrate is so little as negligible. Concretely speaking, each of the substrates 16 is to be made into a semiconductor laser and an antireflection film is formed on its end face.

Next, the inside of the deposition chamber 1 is exhausted by an unshown rotary pump and mechanical booster pump through the exhaust outlet 11 to a medium vacuum ($1\times10^{-2}$ to $1\times10^{-3}$ Pa), and then is exhausted by an unshown cryopump to a high vacuum of $1.5\times10^{-4}$ Pa.

After this, at a point of time when the vacuum of the deposition chamber 1 has reached a target value, oxygen is introduced at a flow rate of 10 sccm through the ionizing gas introducing intake 7 so that the inside of the deposition chamber 1 may be kept at a pressure of $2.6\times10^{-3}$ Pa. And then nitrogen gas is introduced into the deposition chamber 1 through the gas introducing intake 9 as adjusting its flow rate by means of the automatic pressure regulator 10 so that the inside of the chamber 1 may be kept at a pressure of $4.5\times10^{-3}$ Pa. After the above-mentioned preparation for deposition has been finished, thermal electrons emitted from the electron gun 4 having a hot cathode are irradiated onto the raw material $Ti_3O_5$ inside the crucible 3 of cartridge as changing a track of them through a magnetic field.

In this case, the deposition rate is controlled by controlling a voltage applied to the electron gun 4 and changing electric current of the electron gun 4. Details of it are omitted here, since they were described in the first embodiment.

Next, at a phase where the deposition rate has reached a target value, a voltage of 1.0 kV is applied to the ion accelerating electrode 8 of the ion gun 6 to run an ion current of 20 mA inside the ion gun 6. The ion gun 6, which is of hot cathode type, ionizes an element of activated gas by colliding electrons against the activated gas (oxygen). Nitrogen easy to ionize is ionized above the ion gun 6 by electrons emitted from it. Namely, nitrogen ions are generated by generating oxygen ions by means of the ion gun 6 and then making them collide against nitrogen gas. After performing this ionizing process for about 2 seconds, the shutter 5 over the crucible 3 of cartridge type is opened to start depositing a TiON film on the substrates 16.

In a process of depositing a TiON film on the substrates 16, thickness of the TiON film deposited on the monitoring glass substrate 14 is monitored by means of the first and second film thickness monitors 13 and 15 of photoelectric type. At the same time as this, a deposition rate of the TiON film is monitored by means of the deposition rate monitor 12 of crystal oscillator type.

In this case, in order to obtain an optical film of 2.44 in refractive index, a deposition rate is set as 0.5 Å/sec on the basis of FIG. 5, for example. Since a refractive index shown in FIG. 5 was measured with a visible light of 0.63 μm in wavelength, it was evaluated as 2.55 at a deposition rate of 0.5 Å/sec, but it has been experimentally confirmed that the refractive index is evaluated as 2.44 when calibrating it with a light of a semiconductor laser of 1.55 μm in wavelength. Measurement of a refractive index by means of a light of 1.55 μpm in wavelength is slightly shifted from measurement of it by means of a visible light.

As a result of analyzing a grown TiON film by means of a Fourier transform infrared absorption analysis method (FT-IR), it has been confirmed that there are O-N bonds in molecules of the TiON film and they compose a compound.

According to the result of the analysis, a TiON film grown by an optical film forming method of this embodiment has a spectrum where peaks appear on 490 $cm^{-1}$, 436 $cm^{-1}$, and 395 $cm^{-1}$ which show $TiO_2$ and TiN. Thus it has been confirmed that the TION film has an intermediate composition between $TiO_2$ and TiN and has a composition where Ti—O—N and Ti—O—O—N and the like are bonded with each other because its spectrum has three peaks.

From the first and second embodiments, it is known that a refractive index of a TION film can be easily controlled in a range of 2.2 to 2.9.

(Third embodiment)

This embodiment relates to a method for forming an antireflection film of a semiconductor laser using a TION film.

In order to make the best use of functionality of a semiconductor laser, it is necessary to very accurately control reflectivity of it and keep its antireflection film at 0.01% or less in reflectivity.

An antireflection film used in a semiconductor laser or the like is composed of a multi-layered dielectric film which has plural dielectric films in it each of which has thickness of ¼ wavelength of a light to be prevented its reflection.

Up to now, a multi-layered antireflection film composed of dielectric has been composed by layering plural dielectric films on a glass or plastic substrate, but in case of applying such an antireflection film as this to such a semiconductor device as a semiconductor laser, particularly to a compound semiconductor optical device, it has been known that such an antireflection film as this has a limit in its adhesion to a semiconductor layer composing a compound semiconductor optical device, an inner stress of it, its electric characteristics such as an interface level of a semiconductor substrate, a comprehensive life of a device, and the like.

An object of this embodiment is to provide an antireflection film which has a small number of optical films to grow, good adhesive to a substrate, excellent electric characteristics of its contact face, and a long life, so-called, an antireflection film fit for a semiconductor substrate.

The least number of optical film layers necessary for attaining the object, namely, for attaining a reflectivity of 0.01% or less is "2" which is attained by an existing technology, and a two-layered film known by now is a combination of a ZnSe film and an $MgF_2$ film.

A semiconductor laser of 1.55 μm in wavelength attains a two-layered antireflection film of 0.01% in reflectivity by having an optical film of 2.44 in refractive index as the first layer and an optical film of 1.37 in refractive index as the second layer.

As described above, however, ZnSe has two problems.

First, ZnSe cannot fully attain a refractive index of 2.42 to 2.44 even if it is required as an optimal refractive index according to difference in structure of semiconductor lasers. ZnSe has a refractive index of 2.46.

Second, ZnSe has a problem whether or not it is an adequate material in points of physical adhesion to a crystal of InP or InGaAsP, for example, composing a semiconductor laser and stress and durability and electric characteristics in the contact face and the like. For example, ZnSe has such a great problem that when an $MgF_2$ film is formed on a ZnSe film the two films are liable to exfoliate from each other due to an internal stress generated between them, in case that ZnSe is applied to a semiconductor laser.

Now, as an example, a semiconductor laser having an antireflection film a part of which is composed of an optical film good in controllability of its refractive index as described in the first and second embodiments is described in the following.

Figure 6:
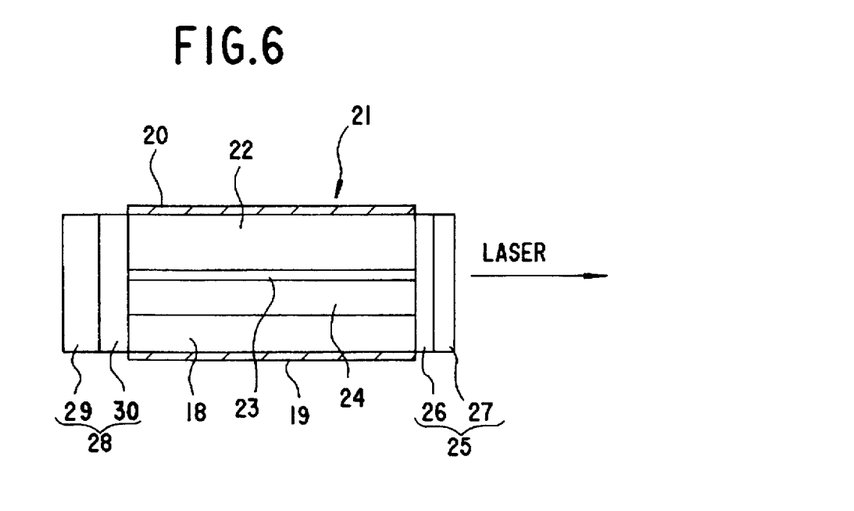
FIG. 6 is a cross-sectional view of a semiconductor laser according to an embodiment of the present invention.

In FIG. 6, a semiconductor laser 21, which has a construction in which an activated layer 23 is held between two clad layers 22 and 24, has an antireflection film 25 formed on one end of it which is composed of a high-refractive-index optical film 26 and a low-refractive-index optical film 27 and has a reflection film 28 formed on the other end of it which is composed of a low-refractive-index optical film 30 and a high-refractive-index optical film 29. Reference symbol 18 shows a semiconductor substrate having the lower clad layer 24 formed on it, symbol 19 shows an electrode formed on the downside face of the semiconductor substrate, and symbol 20 shows an electrode formed on the upper clad layer 22.

The high-refractive-index optical film 26 and the low-refractive-index optical film 27 which compose the antireflection film 25 are, respectively, 2.44 and 1.37 in refractive index, and in thickness they are ¼ wavelength of a light whose reflection is to be prevented. The high-refractive-index optical film 26 is formed directly on one end face of the semiconductor laser 21. It has been found by an ordinary optical computation for obtaining a condition where the incident light and the reflected light are reverse to each other in phase that these refractive indexes are optimal to the antireflection film.

This embodiment uses a TiON film of 2.44 in refractive index as the high-refractive-index optical film 26 of the antireflection film 25 and uses an magnesium fluoride ($MgF_2$) film or a lithium fluoride (LiF) film as the low-refractive-index optical film 27. A method for forming the TiON film composing the high-refractive-index optical film 26 was already described in the first and second embodiments. On the other hand, the high-refractive-index optical film 29 and the lowrefractive-index optical film 30 which compose the reflection film 28 are, respectively, 2.44 and 1.37 in refractive index, and in thickness they are ¼ wavelength of a light to be reflected. The low-refractive-index optical film 30 is formed directly on the other end face of the semiconductor laser 21. This embodiment uses a TiON film of 2.44 in refractive index as the high-refractive-index optical film 29 and an $MgF_2$ film or a LiF film or silicon oxide ($SiO_2$) film as the low-refractive-index optical film 30. A method for forming the TiON film is described in the following.

Figure 7:
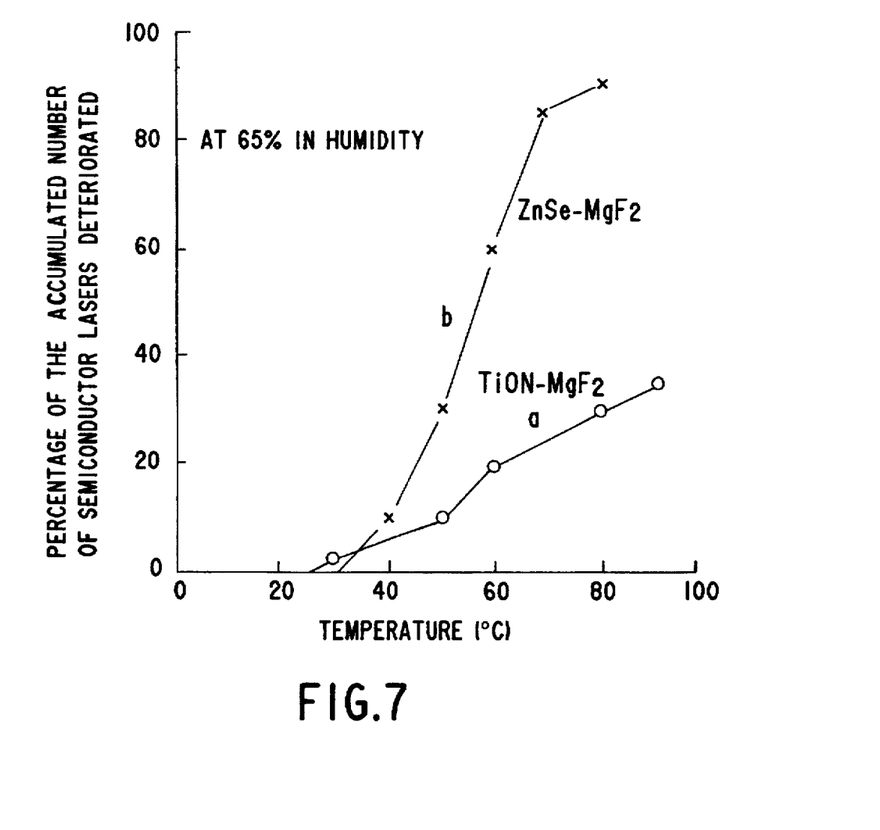
FIG. 7 is a graph showing relation between temperature and a percentage of the accumulated number of semiconductor lasers deteriorated in characteristics in a humidity test in case of applying an optical film of the present invention and in case of applying an optical film of the prior art.

FIG. 7 is a graph showing the relation between temperature and a percentage of the accumulated number of semiconductor lasers deteriorated in characteristics in a humidity test of semiconductor lasers of the third embodiment. The axis of abscissa shows temperature (°C.) and the axis of ordinate shows a percentage of the accumulated number of semiconductor lasers deteriorated in characteristics (%). This figure shows a percentage of the accumulated number of semiconductor lasers deteriorated in characteristics by exfoliation of the reflection film in case of setting the humidity at 65% and changing the temperature.

In FIG. 7, curve a shows a percentage of the accumulated number of semiconductor lasers deteriorated in characteristics of TiON—$MgF_2$ films of this embodiment, and curve b shows a percentage of the accumulated number of semiconductor lasers deteriorated in characteristics of publicly known ZnSe—$MgF_2$ films.

As clearly known from these curves a and b, a percentage of the accumulated number of semiconductor lasers deteriorated in characteristics of the antireflection film 25 of TiON—$MgF_2$ of this embodiment in relation to temperature has been greatly improved as compared with a percentage of the accumulated number of semiconductor lasers deteriorated in characteristics of the ZnSe—$MgF_2$ films.

Although being unshown in a figure, it is found by observing the antireflection films by means of a microscope that the TiON—$MgF_2$ films of this embodiment are only changed in color instead of exfoliated, while the existing ZnSe—$MgF_2$ films are exfoliated. This fact shows that an adhesive force of the ZnSe—$MgF_2$ films to a semiconductor layer is weaker in comparison with an adhesive force of the TiON films to a semiconductor layer. In this case, it is possible to form a TiON film being intermediate in refractive index between $TiO_2$ and TiN by making the TiON film intermediate in composition between $TiO_2$ and TiN. Concrete description of them is omitted here since it was already described.

Figure 8:
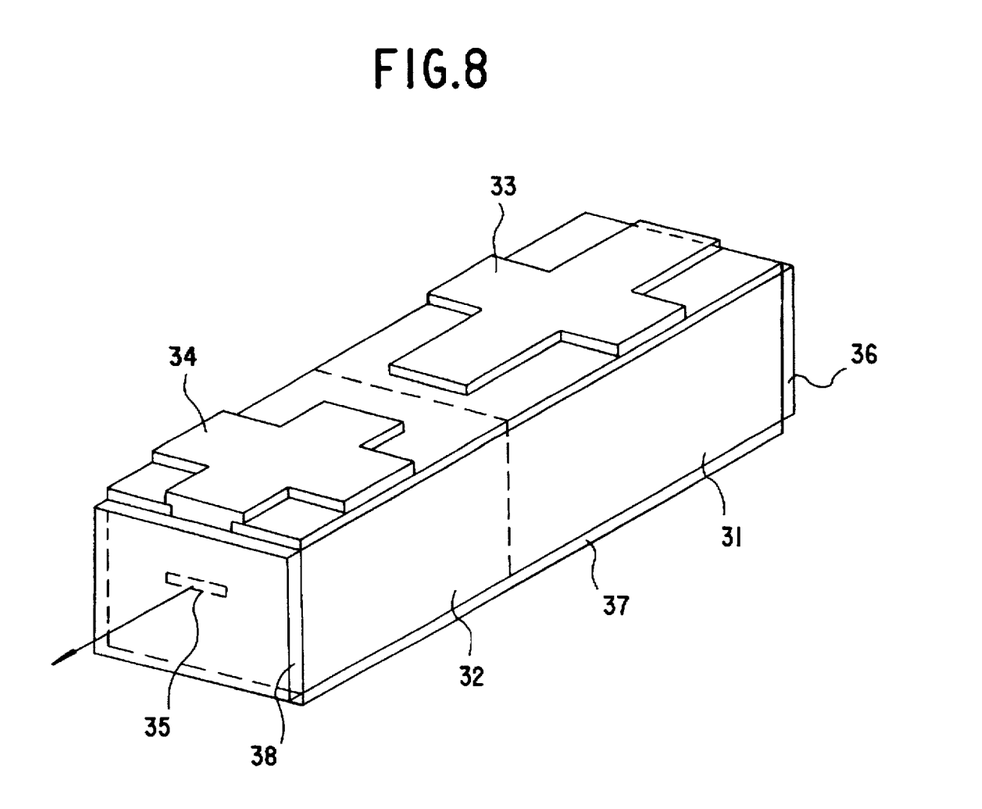
FIG. 8 is an exterior view showing a semiconductor optical device according to another embodiment of the present invention.

FIG. 8 is a perspective view of a semiconductor optical device which has an optical modulator and a DFB laser integrated in it and has the above-mentioned antireflection film formed on it.

The DFB laser 31 and the optical modulator 32 are composed of an InP crystal substrate and an InGaAsP layer grown on it, and the DFB laser 31 and the optical modulator 32 are divided from each other by an InP high-resistance layer. And the DFB laser 31 and the optical modulator 32 respectively have upper electrodes 33 and 34 composed of three layers of Ti, Pt, and Au as well as a common lower electrode 37 composed of two layers of AuGe and Au. An optical output end 35 of the optical modulator 32 is covered with an antireflection film 38 composed of two layers of TiON and $MgFN_2$, and the end face of the DFB laser 31 opposite to the antireflection film 38 is covered with a reflection film 36.

The DFB laser 31 has a diffraction grating along the activated layer, and a laser light of single mode emitted from its output end is introduced into the optical modulator 32 side and is modulated in its waveguide. The optical modulator 32 has a construction for utilizing the Franz-Keldysh effect that the light inside the waveguide is absorbed by reduction of a band gap of the semiconductor layer caused by a high electric field generated by a voltage applied between the upper electrode 34 and the lower electrode 37, and the laser light is modulated by variation of the voltage applied to the optical modulator 32.

By the way, it has an influence upon a degree of single mode of the laser light whether the antireflection film 38 formed on the end face of the optical modulator 32 is excellent or not in performance. Even if the antireflection film 38 satisfies a condition of 0.01% or less in reflectivity, mode change in modulation (chirping) and controllability of the primary mode are varied between a case of using such an optical film as ZnSe slightly shifted in refractive index from a designed value and a case of using a TiON film exactly matched in refractive index with the designed value by controlling its refractive index.

This problem appears as increase of an error bit rate in an actual optical communication system.

The TiON film composing the two-layered antireflection film 38, as described above, is formed by irradiating ions of nitrogen and oxygen onto a semiconductor substrate as well as irradiating $Ti_3O_5$ vaporized by an electron beam onto the semiconductor substrate.

In this case, since a refractive index of the TiON film is determined by a bonding state of the introduced oxygen and nitrogen ions, a refractive index of the TiON film is controlled in a range of 2.2 to 2.9 by changing the bonding state as adjusting its deposition rate. In this way, a high-refractive-index optical film of 2.44 in refractive index is obtained which this embodiment aims at. A film thickness obtained in this case is 1450 Å.

The low-refractive-index optical film is obtained by forming an $MgF_2$ film of 2750 Å in thickness on the TiON film by means of an ordinary electron beam deposition method using $MgF_2$ as a raw material inside the same deposition chamber.

The antireflection film 38 made in such a manner as this was 0.01% in reflectivity and its semiconductor laser was satisfactory in modulator characteristics.

Such an antireflection film may be applied to a light receiving face of a light detecting device or other semiconductor optical devices in addition to a semiconductor laser. The TiON film shows optical absorption of the same degree as ZnSe.

(Fourth embodiment)

In the above-mentioned embodiment, it was described to use a TiON film of 2.2 to 2.9 in refractive index as a high-refractive-index optical film composing an antireflection film. However, in case of using TiON for a high-refractive-index optical film composing a multi-layered reflection film, a TiON growing method as described above cannot be adopted as it is, since a refractive index of 3.0 or more is needed from an optical theory. A TiON film is a dielectric film and does not interfere with oscillation of a semiconductor laser and has a little optical absorption made by its crystal and can be formed at a low temperature, it can be applied to a reflection film if it attains a refractive index of 3.0 or more.

The inventors have found that a TiON film of 3.0 or more in refractive index can be obtained by introducing only nitrogen gas into the deposition chamber 1 through the gas introducing intake 9 and into the ion gun 6 and then bonding nitrogen ions with particles to be deposited from the crucible 3 cartridge type in case of forming a TiON film by means of an ion assist deposition method. According to this method, an optical film which is equivalent to Si or Ge in refractive index and is very little in optical absorption in a range of near infrared has been formed.

This method is described in detail in the following.

Figure 9:
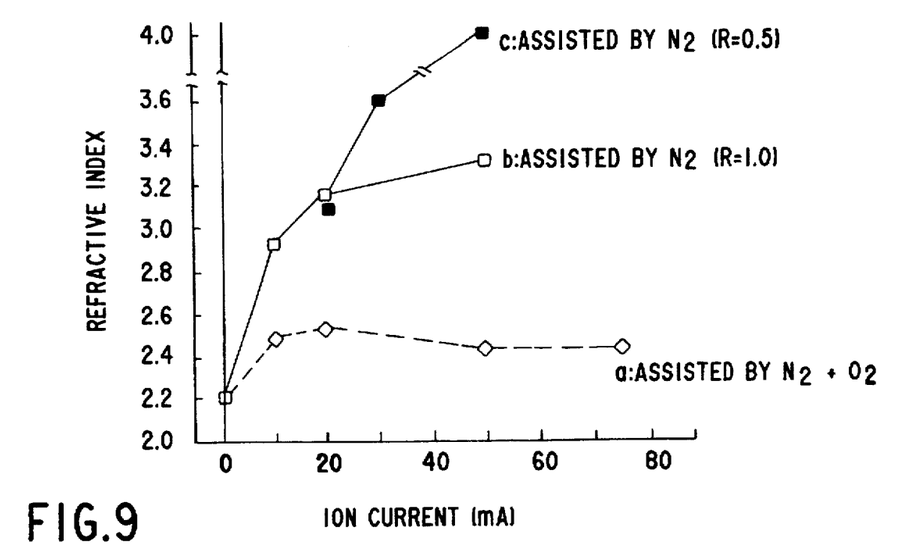
FIG. 9 is a graph showing relation between ionizing current and refractive indexes of optical films respectively in case of ionizing only nitrogen and applying the ionized nitrogen to a substrate and in case of ionizing nitrogen and oxygen and applying the ionized nitrogen and oxygen to a substrate in an ion assist deposition method used in forming optical films of the present invention.

FIG. 9 shows an effect of this embodiment in which only nitrogen ions are irradiated, where the axis of abscissa shows a value of electric current applied to the ion gun 6 and the axis of ordinate shows a refractive index of the TION film.

Curve a shown in FIG. 9 shows a result of measuring a refractive index as changing a deposition rate by changing an amount of electric current applied to the ion gun 6 under a condition of irradiating ions of oxygen and nitrogen at the same time.

It is known that the refractive index reaches a peak when the electric current of the ion gun 6 is 20 mA and the refractive index little varies even if the current is increased more. The reason is that ionizing energy for ionizing the oxygen and nitrogen is given by energy of ion irradiation and becomes saturated as keeping a certain level when it exceeds a peak energy determined according to a kind of activated gas.

Curve b shows that ions to be bonded with TiO can be limited to only nitrogen by performing irradiation of only nitrogen ions and the refractive index is raised by increasing nitrogen content of the TiON film. The reason why the refractive index is still raised when the electric current of the ion gun 6 becomes greater than 20 mA is that since ions of only one element (nitrogen) are irradiated, nitrogen ions are more intensely implanted into the film and so a filling degree of the TiON film is increased.

The inventors have found that a range of adjusting the refractive index is made wider by adjusting a scattering speed of particles of starting material vaporized from the crucible 3 of cartridge type in case of growing a TiON film. When the electric current being run in the ion gun 6 was set as 50 mA and the deposition rate was increased by changing the current of the electron gun 4, a refractive index of 4.0 was obtained. Curve c shows that a filling rate of the film is increased and a range of adjusting the refractive index is widened in case of setting the deposition rate R as 0.5 Å/sec by reducing the electric current of the electron gun 4. In the curve b, the deposition rate R is 1.0 Å/sec.

According to this embodiment, a reflection film is obtained by combining a high-refractive-index TiON film formed by means of an ion assist deposition method where only nitrogen ions are irradiated and another low-refractive-index optical film together. Such a TiON film as this is formed by means of an ion assist deposition apparatus shown in FIG. 1.

In case of forming a TiON film by means of this apparatus, only nitrogen gas is introduced into the deposition chamber 1 through the gas introducing intake 9 and into the ion gun 6 and nitrogen ions emitted from the ion gun 6 are bonded with particles vaporized from the crucible 3 of cartridge type.

A high-refractive-index optical film composed of TiON is used for a laser light of 1.3 µm to 1.55 µm in wavelength. In measuring its refractive index, a laser light of 0.63 µm in wavelength was used. As described above, a refractive index of 2.55 for a light of 0.63 µm in wavelength is slightly shifted to 2.44 for a laser light of 1.55 µm in wavelength. In order to function as a multi-layered reflection film, it is desirable for the high-refractive-index optical film to be controlled in a range of 3.4 to 3.8 in refractive index.

A method for forming a TiON film having such a refractive index is described in the following.

First, substrates 16 are mounted on the downside face of the substrate mounting rotary dome 2 and the crucible 3 of cartridge type filled with $Ti_3O_5$ is set inside the deposition chamber 1. After this, the inside of the deposition chamber 1 is exhausted by an unshown rotary pump and mechanical booster pump through the exhaust outlet 11 to a medium vacuum, and then is exhausted by an unshown cryopump to a high vacuum of $1.5 \times 10^{-4}$ Pa.

At a point of time when the vacuum of the deposition chamber 1 has reached a target value, nitrogen gas is introduced through the ionizing gas introducing intake 7 and a flow rate of the nitrogen gas is adjusted by means of the automatic pressure regulator 10 so that the inside of the deposition chamber 1 may be kept at a pressure of $4.5 \times 10^{-3}$ Pa. After the above-mentioned preparation for deposition has been finished, thermal electrons emitted from the electron gun 4 having a hot cathode are irradiated onto the raw material $Ti_3O_5$ inside the crucible 3 of cartridge type as bending a track of the thermal electrons through a magnetic field. In this case, the growth rate of the TiON film on the substrates 16 is controlled by controlling electric current of the electron gun 4.

At a point of time when the deposition rate has reached a target value, a voltage of 1.0 kV is applied to the ion accelerating electrode 8 of the ion gun 6 of Kaufmann type to run an ion current of 50 mA. And 2 seconds after starting to take out a nitrogen ion beam from the ion gun 6, the shutter 5 over the crucible 3 of cartridge type is opened to start deposition of TiON onto the substrates 16.

In a process of depositing a TiON film on the substrates 16, thickness of the TiON film deposited on the monitoring glass substrate 14 is monitored by means of the first and second film thickness monitors 13 and 15 of photoelectric type, and a deposition rate of the TiON film is monitored by means of the deposition rate monitor 12 of crystal oscillator type.

In this case, a TiON film of 3.6 in refractive index has been formed by keeping the deposition rate at 0.5 Å/sec.

The TiON film formed by this method is less in optical absorption in a range of near infrared than an Si film.

In this manner, it has been confirmed by an experiment that a TiON film having a refractive index in a range of 2.8 to 4.0 can be formed by emitting only nitrogen ions from the ion gun 6 toward the substrates 16.

(Fifth embodiment)

This embodiment relates to a method for forming a reflection film of a semiconductor laser using a TiON film.

Figure 10:
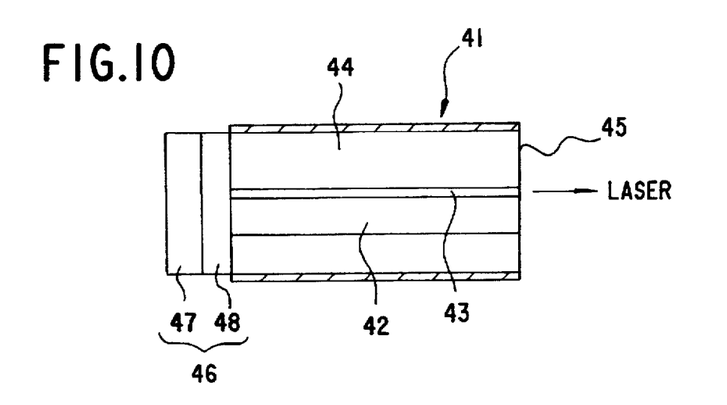
FIG. 10 is a cross-sectional view of a semiconductor laser according to still further another embodiment of the present invention.

FIG. 10 is a side view of a semiconductor laser of this embodiment, where the semiconductor laser 41 has a construction in which an activated layer 43 is held between two clad layers 42 and 44. A cleavage surface 45 is formed at one end face of it which is to be the optical output end and a multi-layered reflection film 46 is formed on a cleavage surface of the other end face of it. A resonator is composed of the cleavage surface 45 and the reflection film 46 and a semiconductor layer between them.

The reflection film 46 uses a TiON film of 3.6 in refractive index as a high-refractive-index optical film 47 of it and an $SiO_2$ film as a low-refractive-index optical film 48 of it. Film thickness of them is ¼ wavelength of the light to be reflected, and the highrefractive-index optical film 47 is disposed outside the low-refractive-index optical film 48.

Although the TiON film is optically similar to a reflection film using Si or Ge, since TiON is less in optical absorption than Si or Ge, the TiON film is more excellent as the high-refractive-index optical film 47 composing the multi-layered reflection film 45.

Such dielectric material as $MgF_2$ and LiF may be used as a low-refractive-index optical film 48.

According to the invention, as described above, since a high-refractive-index layer composing such a multi-layered optical film as a multi-layered antireflection or reflection film is made of oxidic nitride, it is possible to precisely control characteristics of a semiconductor laser by applying the high-refractive-index layer to the semiconductor laser as controlling the refractive index of the oxidic nitride in a range of 2.2 to 4.0 according to a condition of an ion assist deposition method. And by forming such an optical film as this on the optical input and output end faces of such an optical part as a light detecting device, a light emitting device, an optical filter device, and the like, their optical input and output performance can be improved in efficiency.

What is claimed is:

1. An optical film of multi-layered structure comprising a high-refractive-index layer composed of titanium oxynitride and a low-refractive-index layer, said optical film being formed on an optical input/output portion of a semiconductor laser.

2. An optical film in claim 1, wherein the high-refractive-index layer have a refractive index in a range of 2.2 to 4.0 for a visible light.

3. An optical film as defined in claim 1, wherein the low-refractive-index layer is composed of one of magnesium fluoride, lithium fluoride, and silicon dioxide.

4. An optical film forming method comprising the steps of:

forming a low-refractive-index layer on an input/output portion of a semiconductor laser; and forming a titanium oxynitride layer, by an ion assist deposition method, on said low-refractive-index layer as a high-refractive-index layer.

5. An optical film forming method as defined in claim 4, wherein the ion assist deposition method is a film forming method of vaporizing the raw material of the high-refractive-index layer by irradiating electrons from an electron gun onto a block of the raw material, and ionizing gaseous elements differing from each other inside and outside an ion gun, and bonding the ionized gaseous elements together with the vaporized raw material.

6. An optical film forming method as defined in claim 5, wherein the raw material is titanium oxynitride and the gaseous element inside the ion gun is oxygen, and the gaseous element outside the gun is nitrogen.

7. An optical film of multilayered structure comprising;

a high-refractive-index layer and a low-refractive-index layer;

wherein the high-refractive-index layer is composed of a titanium oxynitride film having a refractive index in a range of 2.2 to 2.9 for a visible light, wherein the low-refractive-index layer is composed of one of magnesium fluoride and lithium fluoride, and wherein the multilayered structure is an antireflection film formed on a substrate.

8. An antireflection film forming method comprising:

forming a high-refractive-index layer composed of titanium oxynitride on an optical input/output portion of an optical device by an ion assist deposition method, and forming a low-refractive-index layer on the high-refractive-index layer;

wherein the ion assist deposition method is a film forming method of vaporizing a raw material of the high-refractive index layer by irradiating electrons from an electron gun onto a block of the raw material and irradiating the vaporized raw material onto an optical input/output portion and at the same time ionizing gaseous elements different from each other inside and outside an ion gun and bonding the ionized gaseous elements together with the vaporized raw material.

9. An antireflection film forming method as defined in claim 8, wherein the raw material is titanium oxynitride and the gaseous element inside the ion gun is oxygen, and the gaseous element outside the ion gun is nitrogen.

10. An antireflection film forming method as defined in claim 8, wherein oxygen is ionized by the ion gun together with the raw material and nitrogen is ionized by the oxygen ions.

11. An antireflection film forming method as defined in claim 8, wherein a refractive index of the high-refractive-index layer is adjusted by changing a deposition rate of the high-refractive-index layer through changing electric current supplied to the electron gun.

12. An antireflection film forming method as defined in claim 8, wherein a refractive index of the high-refractive-index layer is adjusted by adjusting a voltage applied to the electron gun.

13. An antireflection film forming method as defined in claim 8, wherein a refractive index the high-refractive-index layer is controlled by adjusting an electric parameter applied to the ion gun.

14. A reflection film forming method comprising:

forming a low-refractive-index layer on an optical input/output portion of an optical device; and forming a high-refractive-index layer composed of titanium oxynitride on the low-refractive-index layer by an ion assist deposition method, wherein the ion assist deposition method is a film forming method of vaporizing titanium oxide as a raw material of the high-refractive-index layer by irradiating electrons from an electron gun onto a block of the raw material, at the same time ionizing a gaseous element of nitrogen from an ion guns, and bonding the ionized gaseous element together with the vaporized raw material.

15. A reflection film forming method as defined in claim 14, wherein a refractive index of the high-refractive-index layer is controlled by adjusting a electric current applied to the ion gun.

16. A reflection film forming method as defined in claim 14, wherein the vaporized raw material composed of titanium oxide and ionized nitrogen only are irradiated onto the low-refractive-index layer.

17. A reflection film forming method as defined in claim 14, wherein said refractive index of the high-refractive-index layer is adjusted by changing a deposition rate in the ion assist deposition method.

18. A semiconductor laser, comprising:

a laser construction having an activated layer held between two clad layers;

a first electrode formed on an upper surface of said laser construction;

a second electrode formed on a bottom surface of said laser construction;

a first high-refractive-index layer composed of titanium oxynitride formed on one side of the laser construction;

and a first low-refractive-index layer formed on the first high-refractive-index layer.

19. The semiconductor laser of claim 18, wherein said first low-refractive-index layer is composed of one of magnesium fluoride, lithium fluoride and silicon dioxide.

20. The semiconductor laser of claim 18, further comprising a second low-refractive-index layer formed on another side of the laser construction; and a second high-refractive-index layer composed of titanium oxynitride formed on said second low-refractive-index layer.

21. The semiconductor laser of claim 20, wherein said second low-refractive-index layer is composed of one of magnesium fluoride, lithium fluoride and silicon dioxide.

22. An optical film forming method comprising the steps of:

forming a titanium oxynitride layer, by an ion assist deposition method, as a high-refractive-index layer onto an input/output portion of a semiconductor laser; and forming a low-refractive-index layer onto the titanium oxynitride layer.

23. An optical film forming method as defined in claim 22, said ion assist deposition method comprising the following steps of:

vaporizing the raw material of the high-refractive-index layer by irradiating electrons from an electron gun onto a block of the raw material, and ionizing gaseous elements differing from each other inside and outside an ion gun, and bonding the ionized gaseous elements together with the vaporized raw material.

24. An optical film forming method as defined in claim 23, wherein the raw material is titanium oxynitride and the gaseous element inside the ion gun is oxygen, and the gaseous element outside the gun is nitrogen.

* * * * *